United States Patent
Black et al.

(10) Patent No.: US 6,320,400 B1
(45) Date of Patent: Nov. 20, 2001

(54) METHOD AND SYSTEM FOR SELECTIVELY DISCONNECTING A REDUNDANT POWER DISTRIBUTION NETWORK TO INDENTIFY A SITE OF A SHORT

(75) Inventors: J. Courtney Black, San Jose; Richard C. Blish, II, Saratoga; Mehrdad Mahanpour, Union City; Mohammad Massoodi, Campbell; S. Sidharth, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/208,713

(22) Filed: Dec. 9, 1998

(51) Int. Cl.⁷ .............................. G01R 31/02; G01R 31/26
(52) U.S. Cl. ............................................ 324/765; 324/763
(58) Field of Search ...................................... 324/765, 763, 324/512, 771, 619; 714/4

(56) References Cited

U.S. PATENT DOCUMENTS

| | | | |
|---|---|---|---|
| 3,441,849 | * | 4/1969 | Bennett et al. ....................... 324/512 |
| 4,956,602 | * | 9/1990 | Parrish ................................. 324/537 |
| 5,869,977 | * | 1/1999 | Kalb et al. ............................ 324/765 |

* cited by examiner

Primary Examiner—Safet Metjahic
Assistant Examiner—Anjan K Deb
(74) Attorney, Agent, or Firm—Sawyer Law Group LLP

(57) ABSTRACT

A system and method for identifying a location of a short in a circuit of a semiconductor device is disclosed. The method and system includes providing a power supply and providing a power distribution network coupled to the power supply. The power distribution network is for distributing power to a portion of the circuit. The power distribution network further including means for selectively disconnecting a portion of the power distribution network. The portion of the power distribution network supplies power to the location of the short.

4 Claims, 5 Drawing Sheets

METHOD AND SYSTEM FOR SELECTIVELY DISCONNECTING A REDUNDANT POWER DISTRIBUTION NETWORK TO INDENTIFY A SITE OF A SHORT

FIELD OF THE INVENTION

The present invention relates to semiconductor devices and more particularly to a method and system for identifying sites of a short utilizing a power distribution network within the semiconductor device.

BACKGROUND OF THE INVENTION

Semiconductor devices often include circuitry formed in an active area of a semiconductor die. In order to supply power to the circuits formed on the die, a conventional power distribution network couples the power supply to circuits on the die. Once power is is supplied to circuits on the die, the semiconductor device can perform its intended function.

Circuits in the semiconductor device are subject to faults. One such fault is a short. Shorts may be difficult to detect electrically. Thus, conventional methods of detecting shorts use liquid crystal to sense heat generated by such a short. One conventional method uses a thin layer of liquid crystal poured over the circuits at the top of the die. When power is applied to the die, the liquid crystal phase over some hot spots in the circuits. Due to the phase change, the color of the liquid crystal changes over the hot spots. The centers of areas where the liquid crystal has changed color mark the locations of shorts in the circuit. Consequently, the position of shorts in the circuit can be detected.

Conventional liquid crystal detection this method has several drawbacks. Liquid crystal detection is primarily useful where the short is near a readily accessible surface. If the short is buried, liquid crystal detection may not detect the short because heat is dissipated rapidly in the die. Conventional liquid crystal detection also biases the semiconductor die such that a short will cause the temperature of the surrounding area to rise above the temperature of the liquid crystal phase transition. This biasing may be difficult or time consuming to accomplish. Finally, liquid crystal is carcinogenic. Consequently, health precautions must be taken during use of the liquid crystal.

Accordingly, what is needed is an improved system and method for detecting shorts in a circuit of a semiconductor die. The present invention addresses such a need.

SUMMARY OF THE INVENTION

The present invention provides a method and system for identifying a location of a short in a circuit of a semiconductor device. The method and system includes providing a power supply and providing a power distribution network coupled to the power supply. The power distribution network is for distributing power to a portion of the circuit. The power distribution network further including means for selectively disconnecting a portion of the power distribution network. The portion of the power distribution network supplies power to the location of the short.

According to the system and method disclosed herein, the present invention allows shorts to be detected electronically thereby simplifying detection of faults.

DETAILED DESCRIPTION OF THE INVENTION

The present invention relates to an improvement in detection of faults in a semiconductor die. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
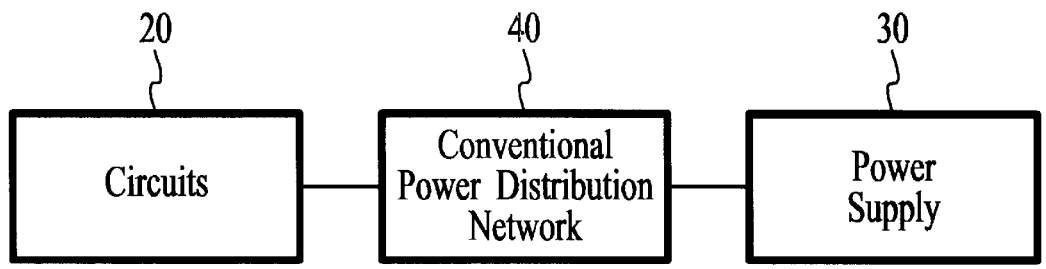
FIG. 1 is a block diagram of a semiconductor device.

FIG. 1 is a block diagram of a conventional semiconductor device 10. The semiconductor device often includes circuits 20 formed in an active area of a semiconductor die. A power supply 30 provides power to the circuits 20. A conventional power distribution network 40 couples the power supply 30 to the circuits 20. Once power is supplied to circuits on the die, the semiconductor device can perform its intended function.

Figure 2A:
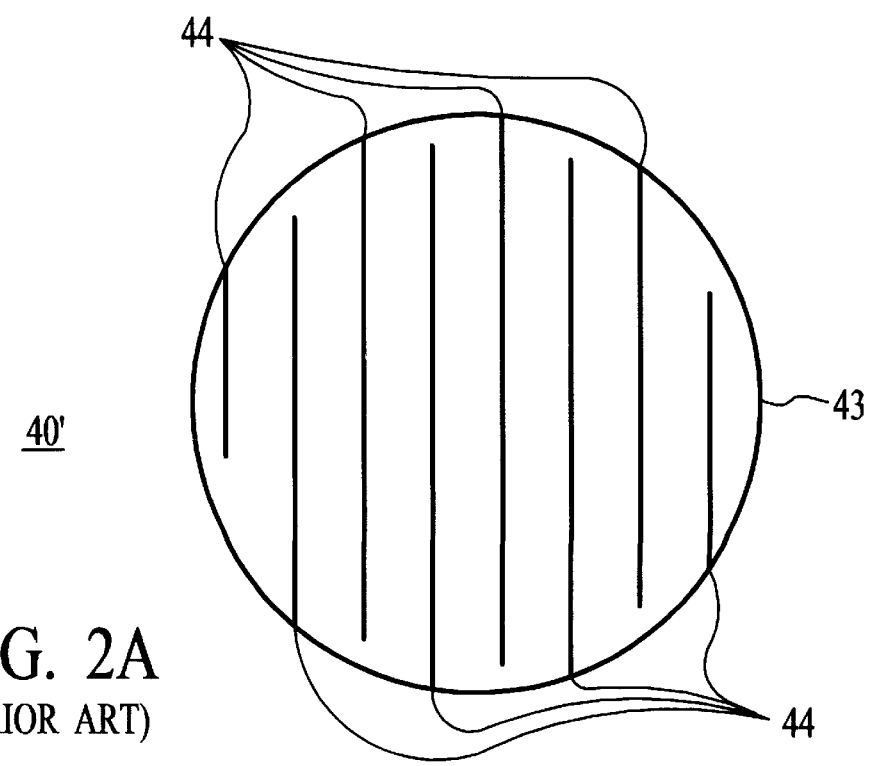
FIG. 2A is a diagram depicting a conventional power distribution network.
Figure 2B:
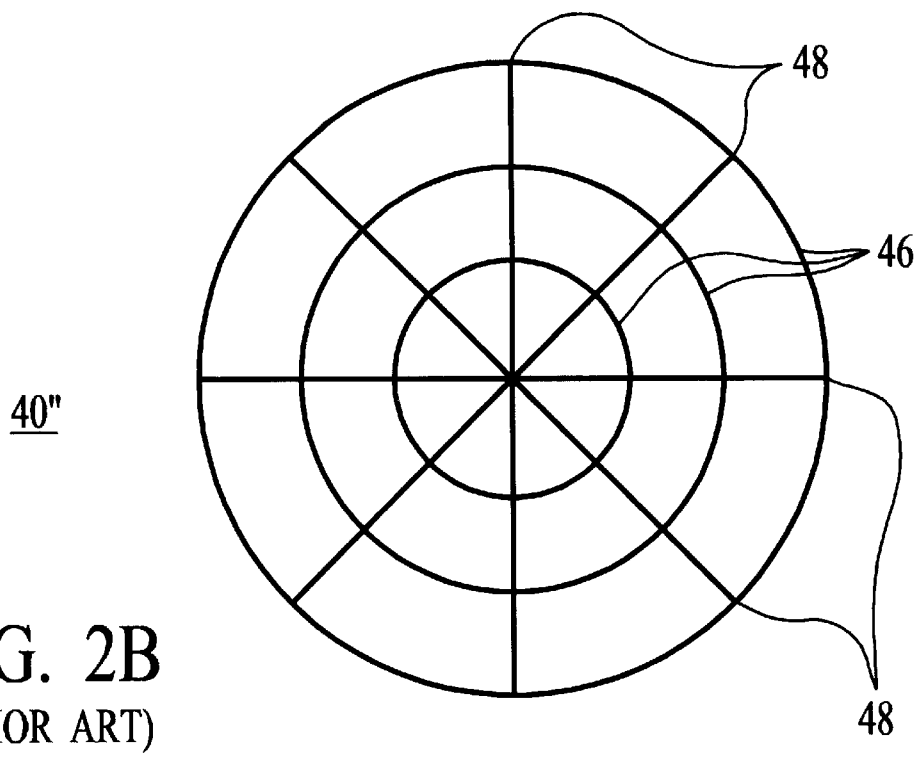
FIG. 2B is a diagram depicting another conventional power distribution network.

FIGS. 2A and 2B depict conventional power distribution networks 40' and 40", respectively. Referring to FIG. 2A, a conductive ring 43 is coupled to the power supply 30. Conductive lines 44 supply power to the circuits 20. In addition to the lines 44, the conventional power distribution network 40' may contain additional lines (not shown) coupled with the lines 44 or the ring 43 to ensure that power can be supplied to all of the circuits 20. Referring now to FIG. 2B, the conventional power distribution network 40" contains multiple concentric conductive rings 46 coupled to the power supply 30. The rings 46 are coupled to conductive lines 48. In addition to the lines 48, the conventional power distribution network 40" may contain additional lines (not shown) coupled with the lines 48 or the rings 46 to ensure that power can be supplied to all of the circuits 20.

Although the conventional semiconductor device 10 functions, one of ordinary skill the art will readily recognize that the circuits 20 may contain shorts. Shorts may be difficult to detect electrically because there may be multiple paths from the power supply 30 through the conventional power distribution network 40 to the portions of the circuit 20 having the shorts. For example, there may be multiple paths from a line 44 or 48 to the portion of circuit in which a short is located. Consequently, in the conventional semiconductor device 10, shorts are not detected electrically. Instead, the heat generated by shorts is used. For example, one conventional method places a liquid crystal in close proximity to the circuits 20. Shorts may generate sufficient heat to cause portions of the liquid crystal to undergo a phase transition, changing the color of the liquid crystal in these areas. The areas of the liquid crystal which have changed color mark the location of the shorts.

One of ordinary skill in the art will also realize that the conventional method for detecting shorts has drawbacks. Liquid crystal detection is useful primarily where the short is near a readily accessible surface. Otherwise, heat generated by the short may merely be dissipated in the conventional semiconductor device 10, making the short difficult to detect. Conventional liquid crystal detection also biases the semiconductor die so that heat generated by a short should be sufficient to cause the liquid crystal to undergo a phase transition in a particular area. This biasing may be difficult or time consuming to accomplish. Finally, liquid crystal is carcinogenic. Consequently, use of the conventional liquid crystal method of detection is both tedious and hazardous to the health of users.

The present invention provides a method and system for identifying a location of a short in a circuit of a semiconductor device. The method and system includes providing a power supply and providing a power distribution network coupled to the power supply. The power distribution network is for distributing power to a portion of the circuit. The power distribution network further including means for selectively disconnecting a portion of the power distribution network. The portion of the power distribution network supplies power to the location of the short.

The present invention will be described in terms of a particular semiconductor die and a particular configuration of a power distribution network. However, one of ordinary skill in the art will readily recognize that this method and system will operate effectively for other types of semiconductor devices and for other configurations of the power distribution network.

Figure 3:
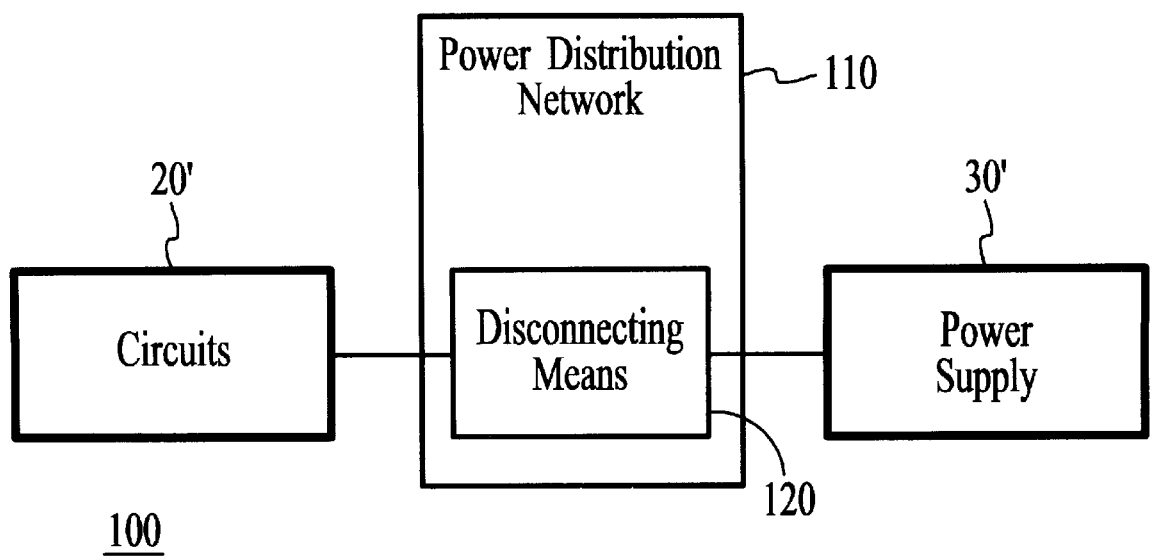
FIG. 3 is a block diagram of a semiconductor device in accordance with the present invention.

To more particularly illustrate the method and system in accordance with the present invention, refer now to FIG. 3 depicting a block diagram of one embodiment of such a semiconductor die 100 in accordance with the present invention. Portions of the semiconductor device 100 are similar to portions of the conventional semiconductor device 10. Consequently, these portions will be labeled similarly.

The semiconductor device 100 includes circuits 20' and a power supply 30'. The semiconductor device 100 also includes a power distribution network 110 in accordance with the present invention. Within the power distribution network 110, is disconnecting means 120. Disconnecting means 120 are for selectively disconnecting a portion of the power distribution network 110.

Figure 4A:
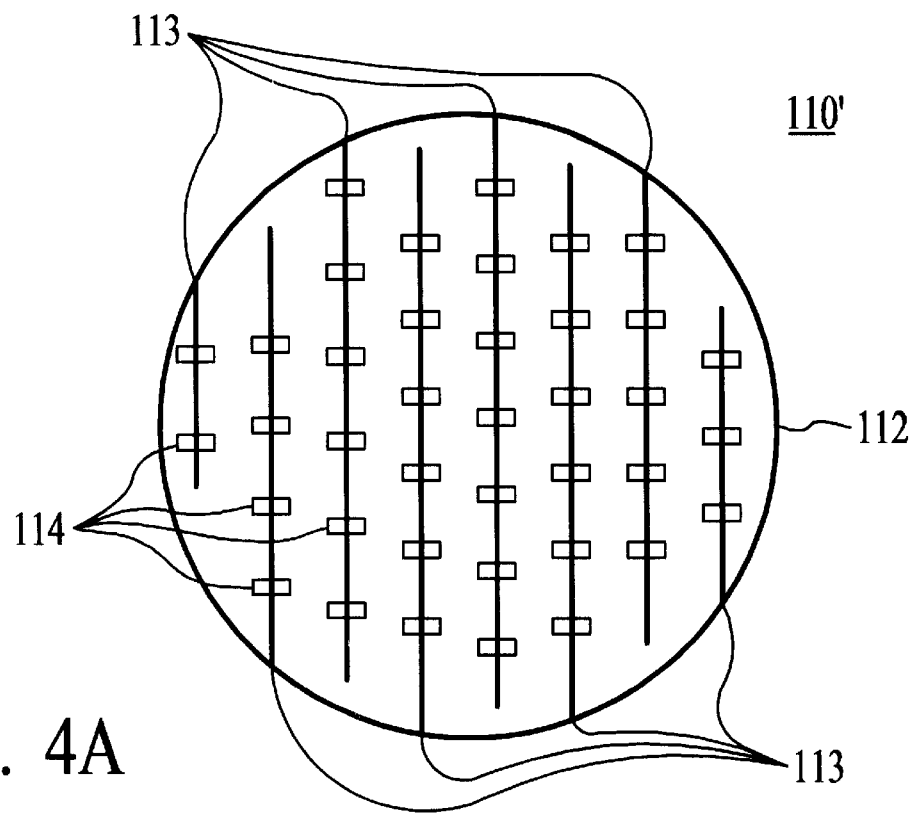
FIG. 4A is a diagram depicting one embodiment of a power distribution network in accordance with the present invention.
Figure 4B:
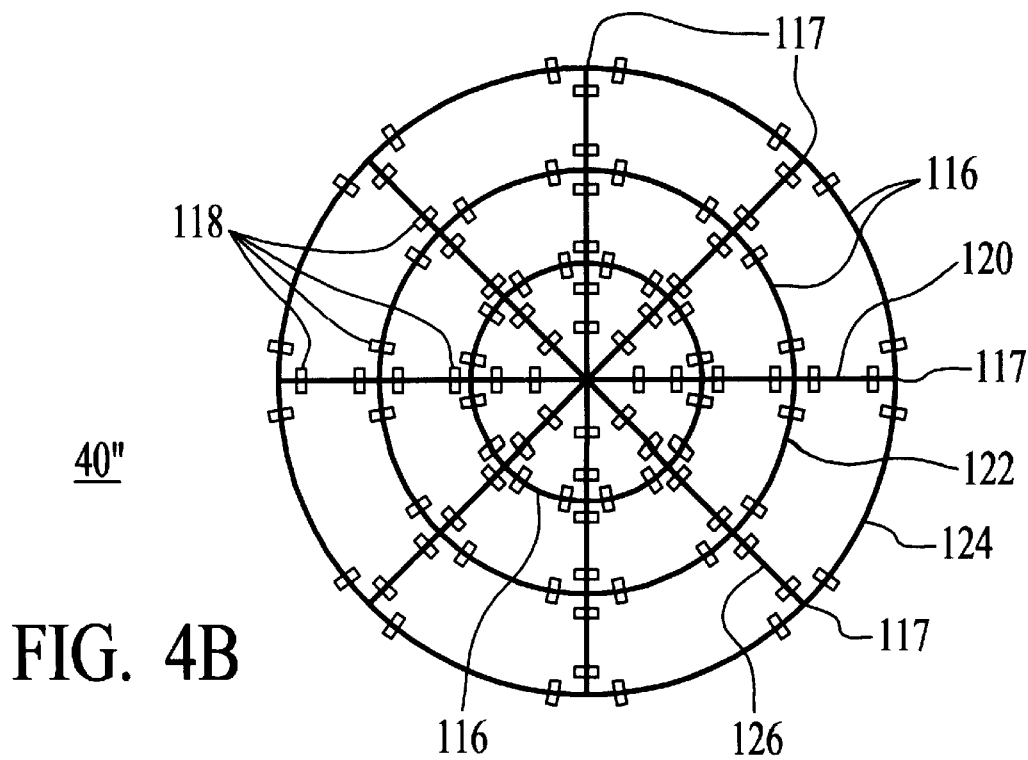
FIG. 4B is a diagram depicting another embodiment of a power distribution network in accordance with the present invention.

FIGS. 4A and 4B depict embodiments 110' and 110" of the power distribution network 110 in accordance with the present invention. Referring to FIG. 4A, a conductive ring 112 is coupled to the power supply 30'. Conductive lines 113 supply power to the circuits 20'. In addition to the lines 113, the power distribution network 110' may contain additional lines (not shown) coupled with the lines 113 or the ring 112 to ensure that power can be supplied to all of the circuits 20'. The power distribution network 110'depicted in FIG. 4A also includes switches 114 in each of the lines 113. The additional lines may also include switches 114. Using the switches 114, selected portions of each of the lines 113 can be isolated from the remaining portion of the power distribution network 110'. Thus, selected portions of the lines 113 can be isolated from the power supply 20'.

Referring now to FIG. 4B, the power distribution network 110" contains multiple concentric conductive rings 116 coupled to the power supply 30'. Conductive lines 117 are coupled to the circuits 20'. In addition to the lines 117, the power distribution network 110' may contain additional lines (not shown) coupled with the lines 117 or the rings 116 to ensure that power can be supplied to all of the circuits 20'. The power distribution network 110" also includes switches 118 in each of the lines 117. The rings 116 would also contain switches 118. Thus, there are four switches 118 at every intersection of the rings 116 and the lines 117, one on each side of the intersection. Using the switches 118 selected portions of each of the lines 117 and the rings 116 can be isolated from the remaining portion of the power distribution network 110". Thus, selected portions of the lines 117 can be isolated from the power supply 30'. Note that portions 120 and 126 of two lines 117 and portions 122 and 124 of two rings 116 are depicted. The combination of the portions 120 and 126 of two lines 117 and the portions 122 and 124 of two rings 116 supply power to the portion of the circuits 20' surrounded by the portions 120, 122, 124, and 126.

Figure 5:
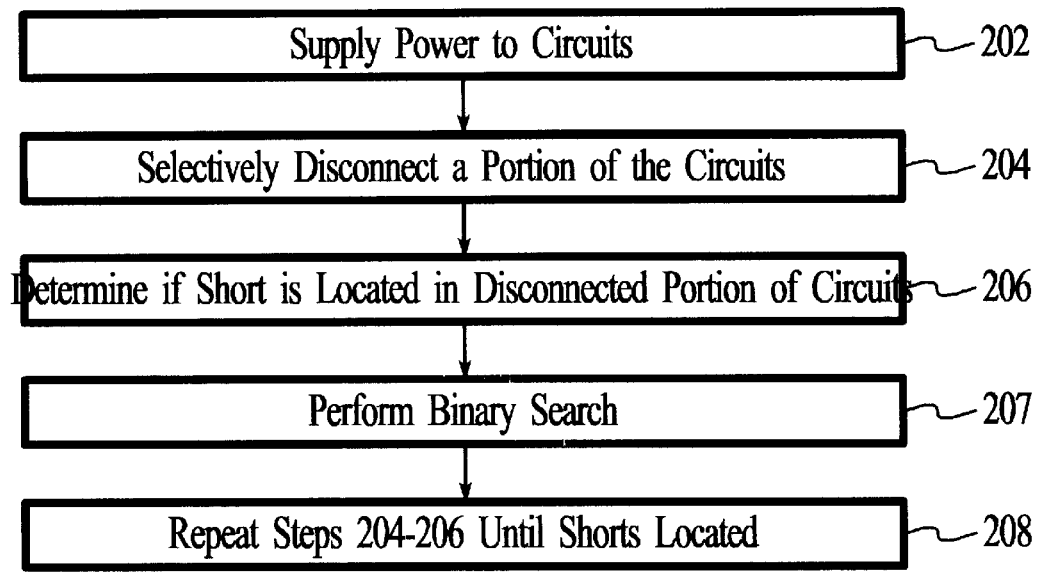
FIG. 5 is a flow chart depicting one embodiment of a method for determining the location of a short in accordance with the present invention.

FIG. 5 depicts a method 200 for detecting faults in accordance with the present invention using a binary seach. The method 200 utilizes the system 100. Thus, the method 200 may use the power distribution network 110' or the power distribution network 110".

Power from the power supply 30' is supplied to the circuits 20' using the power supply network 110, via step 202. In order to detect shorts, portions of the power supply network 110 are selectively disconnected, via step 204. This is accomplished using the disconnecting means 120. In one embodiment, step 204 is performed by selectively opening some of the switches 114 or 118 in the power distribution network 110' or 110", respectively. For example, two switches 114 for a linear geometry or four switches 118 for a rectangular or polar (two dimensional) geometry can be opened in order to isolate the portion of the power distribution network 110' or 110", respectively, between the switches 114 or 118, respectively. For example, in step 204, the switches 118 surrounding the segment 120, 122, 124 or 126 could be opened to isolate the segments 120, 122, 124 or 126 depicted in FIG. 4B. Similarly, step 204 could include opening two of the switches 114 on a particular one of the lines 113 to isolate a part of one of the lines 113 depicted in FIG. 4A. Consequently, any elements of the circuits 20' of the semiconductor die 100 connected only to the isolated segment will not have power.

Via step 206, it is determined if the short was in the portion of the circuit disconnected in step 204. In one embodiment, the circuits 20' are electrically analyzed to determined if a short has disappeared in step 206. If so, the short is located in the portion of the circuits 20' which received power from the disconnected portion of the power distribution network 110. If a short is in the portion of the circuits 20' disconnected from the power supply in step 204, then a binary search may performed to better determine the location of the short, via step 207. The binary search will be further discussed below. Steps 204 through 207 are then repeated until the shorts are detected, via step 208.

Figure 6:
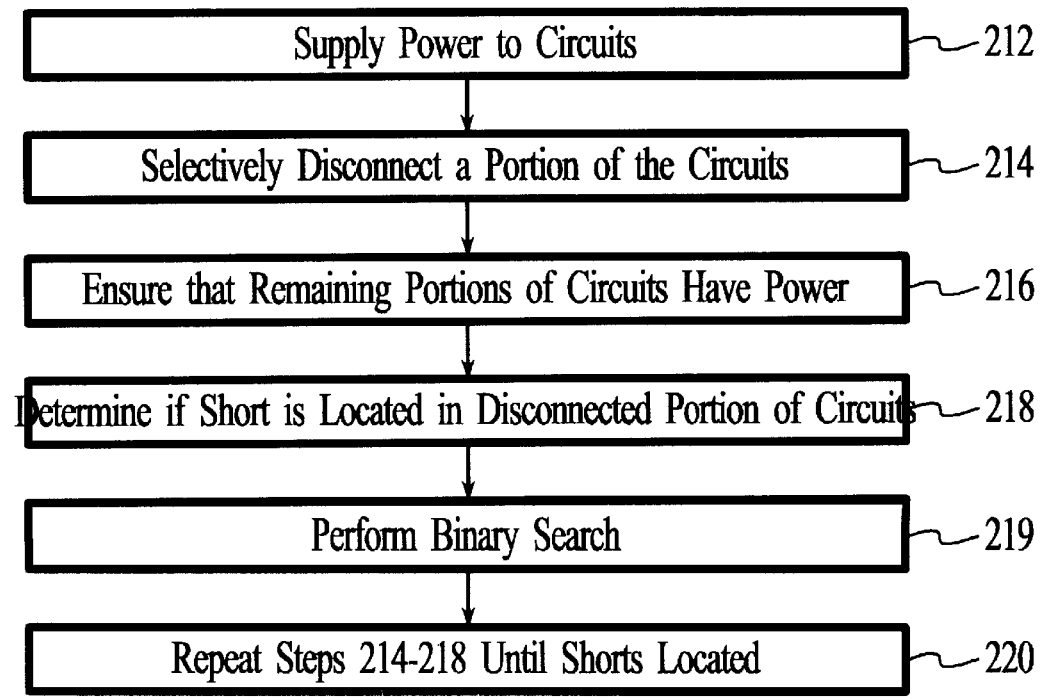
FIG. 6 is a flow chart depicting another embodiment of a method for determining the location of a short in accordance with the present invention.

FIG. 6 depicts another embodiment of a method 210 for detecting shorts in accordance with the present invention. Steps 212 through 214 of the method 210 are the same as for the method 200. Thus, power is supplied to the circuits 20' and a portion of the power distribution network 110 is selectively disconnected via step 212 and 214, respectively. It is also ensured that selectively disconnected portions of the power distribution network do not prevent power from being supplied to the remainder of the circuits 20', via step 216. In one embodiment, step 216 is performed by ensuring that a power distribution network 110 similar to the power distribution network 110'' is utilized. Because the power distribution network 110'' includes concentric rings 116, electrically isolating a portion of one of the lines 117 does not isolate another portion of the line 117. Thus, other portions of the circuit 20' are not starved for power by disconnecting a portion of the power distribution network 110''.

Via step 218, it is determined if the short was in the portion of the circuit disconnected in step 214. In one embodiment, the circuits 20' are electrically analyzed to determine if a short has disappeared in step 218. If so, the short is located in the portion of the circuits 20' which received power from the disconnected portion of the power distribution network 110. If a short is in the portion of the circuits 20' disconnected from the power supply in step 214, then a binary search may performed to better determine the location of the short, via step 219. The binary search will be further discussed below. Steps 214 through 219 are then repeated until the shorts are detected in step 220.

Figure 7:
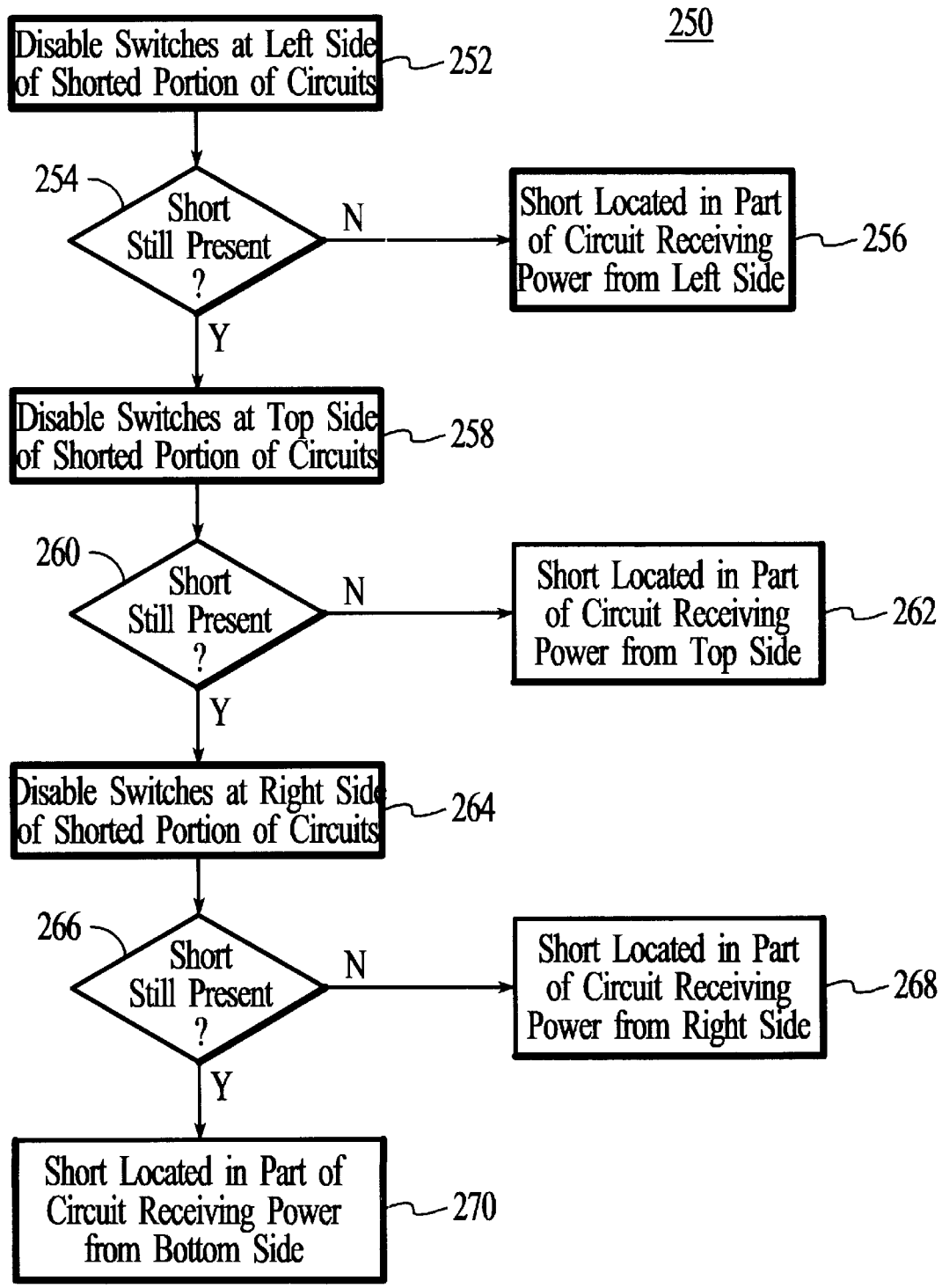
FIG. 7 is a flow chart depicting one embodiment of a binary search method for better determining the location of the short in accordance with the present invention.

FIG. 7 depicts a binary search method 250 for better determining the location of a short. As discussed above, the method 250 may be used in step 207 and 219. For example, presume that in step 206 or 218 the short was determined to be located in the portion ("shorted portion") of the circuits 20' surrounded by the portions 120 and 126 of the lines 117 and the portions 122 and 124 of the rings 116. The switches 118 on left side of the shorted portion are disabled, via step 252. Thus, in step 252, the switches 118 of the portion 122 are opened. It is then determined whether the short is still present, via step 254. If the short is not present, then the short is determined to be located in a part of the circuits 20' receiving power from the portion 122 of the ring 116, via step 256. If the short is still present, then the switches 118 at the top of the shorted portion (switches 118 in the portion 120) are disabled, via step 258. It is then determined whether the short is still present, via step 260. If the short is not present, then the short is determined to be located in a part of the circuits 20' receiving power from the portion 120 of the line 117, via step 262. If the short is still present, then the switches 118 at the right of the shorted portion (switches 118 in the portion 124) are disabled, via step 264. It is then determined whether the short is still present, via step 266. If the short is not present, then the short is determined to be located at a part of the circuits 20' receiving power from the portion 124 of the ring 116, via step 268. If the short is still present, then the short is determined to be located in the portion of the circuits 20' receiving power from the portion 126 of the ring 126, via step 270.

Because the portions of the circuit 20' in which the shorts are located can be electrically determined, conventional heat detection methods can be avoided. The locations of shorts which may be relatively deep within the semiconductor device can also be determined. Furthermore, the use of the carcinogenic liquid crystal can be avoided.

A method and system has been disclosed for detecting shorts in a semiconductor device be selectively disconnected portions of a power supply network. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for identifying a location of a short in a circuit of a semiconductor device, comprising:
   a power supply; and
   a power distribution network coupled to the power supply for distributing power to a first portion of the circuit, the power distribution network further including means for selectively disconnecting each of a plurality of portions of the power distribution network, each of the plurality of portions of the power distribution network supplying power to a second portion of the circuit, a particular portion of the plurality of portions of the power distribution network supplying power to the short, the power distribution network being integrated into a semiconductor die;
   wherein the power distribution network, the means for selectively disconnecting and the circuit reside on the semiconductor die.

2. The system of claim 1 wherein the disconnecting means further include a plurality of switches.

3. The system of claim 1 wherein the power distribution network further includes:
   a plurality of concentric conductive rings coupled to the power supply.

4. The system of claim 1 wherein the location of the short is in a third portion of the circuit and wherein the power distribution network further includes:
   means coupled to the disconnecting means for ensuring that disconnecting each portion of the plurality or portions of the power distribution network allows power to be supplied to a fourth portion of the circuit.

* * * * *

UNITED STATES PATENT AND TRADEMARK OFFICE
CERTIFICATE OF CORRECTION

PATENT NO.    : 6,320,400 B1
DATED         : November 20, 2001
INVENTOR(S)   : J. Courtney Black et al.

It is certified that error appears in the above-identified patent and that said Letters Patent is hereby corrected as shown below:

<u>Title page,</u>
Title, please remove "INDENTIFY" and replace with -- IDENTIFY --.

Signed and Sealed this

Nineteenth Day of March, 2002

Attest:

JAMES E. ROGAN
*Attesting Officer*    *Director of the United States Patent and Trademark Office*